(12) United States Patent
Kim et al.

(10) Patent No.: US 10,559,340 B2
(45) Date of Patent: Feb. 11, 2020

(54) SEMICONDUCTOR DEVICE

(71) Applicant: SK hynix Inc., Icheon-si, Gyeonggi-do (KR)

(72) Inventors: Woongrae Kim, Icheon-si (KR); Sangkwon Lee, Yongin-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/434,519

(22) Filed: Jun. 7, 2019

(65) Prior Publication Data

US 2019/0287609 A1 Sep. 19, 2019

Related U.S. Application Data

(63) Continuation-in-part of application No. 15/653,026, filed on Jul. 18, 2017, now Pat. No. 10,366,732.

(30) Foreign Application Priority Data

Mar. 27, 2017 (KR) .................. 10-2017-0038477

(51) Int. Cl.
| | |
|---|---|
| G11C 5/00 | (2006.01) |
| G11C 11/406 | (2006.01) |
| G11C 11/408 | (2006.01) |
| G11C 11/4093 | (2006.01) |
| G11C 7/10 | (2006.01) |
| G11C 11/4096 | (2006.01) |

(52) U.S. Cl.
CPC ........ *G11C 11/40607* (2013.01); *G11C 7/106* (2013.01); *G11C 7/109* (2013.01); *G11C 7/1057* (2013.01); *G11C 7/1063* (2013.01); *G11C 7/1084* (2013.01); *G11C 7/1087* (2013.01); *G11C 11/4082* (2013.01); *G11C 11/4087* (2013.01); *G11C 11/4093* (2013.01); *G11C 11/4096* (2013.01); *G11C 11/40615* (2013.01)

(58) Field of Classification Search
CPC ....................................................... G11C 5/00
USPC ................................................. 365/233, 226
See application file for complete search history.

(56) References Cited

U.S. PATENT DOCUMENTS

| | | | |
|---|---|---|---|
| 6,594,770 B1 | 7/2003 | Sato et al. | |
| 2002/0191480 A1* | 12/2002 | Matsumoto | G11C 7/1078 365/233.1 |

FOREIGN PATENT DOCUMENTS

KR 100269313 B1 12/2000

* cited by examiner

*Primary Examiner* — Jason Lappas
(74) *Attorney, Agent, or Firm* — William Park & Associates Ltd.

(57) ABSTRACT

A semiconductor device includes a first buffer circuit configured to generate a first internal chip select signal by buffering a chip select signal in response to a buffer control signal; a second buffer circuit configured to generate a second internal chip select signal by buffering the chip select signal in response to the buffer control signal; and a control circuit configured to generate the buffer control signal by sensing logic levels of a reset signal and the second internal chip select signal, and generate an initialization signal which is enabled during an initializing operation period, in response to the reset signal and the buffer control signal.

21 Claims, 11 Drawing Sheets

SEMICONDUCTOR DEVICE

CROSS-REFERENCE TO RELATED APPLICATION

The present application is a continuation-in-part application of U.S. patent application Ser. No. 15/653,026, filed on Jul. 18, 2017, and claims priority under 35 U.S.C. § 119(a) to Korean Patent Application No. 10-2017-0038477 filed on Mar. 27, 2017 in the Korean Intellectual Property Office, which is incorporated herein by reference in its entirety.

BACKGROUND

1. Technical Field

Embodiments of the disclosure may generally relate to a semiconductor device which performs an initializing operation and a refresh operation.

2. Related Art

A semiconductor device performs an initializing operation and a refresh operation for a plurality of memory cells. The initializing operation is an operation of initializing the plurality of memory cells or initializing the operation of an internal circuit, and the refresh operation is an operation of sequentially activating the plurality of memory cells and sensing and amplifying the data stored in the memory cells, thereby securing the reliability of the data. In such an initializing operation and refresh operation, it is important to limit an amount of leakage current to a minimum in order to reduce power consumption.

SUMMARY

In an embodiment, a semiconductor device may include a first buffer circuit configured to generate a first internal chip select signal by buffering a chip select signal in response to a buffer control signal; a second buffer circuit configured to generate a second internal chip select signal by buffering the chip select signal in response to the buffer control signal; and a control circuit configured to generate the buffer control signal by sensing logic levels of a reset signal and the second internal chip select signal, and generate an initialization signal which is enabled during an initializing operation period, in response to the reset signal and the buffer control signal.

In an embodiment, a semiconductor device may include a first buffer circuit configured to generate a first internal chip select signal by buffering a chip select signal in response to a buffer control signal; a second buffer circuit configured to generate a second internal chip select signal by buffering the chip select signal in response to the buffer control signal; and a control circuit configured to generate the buffer control signal which is enabled when entering an initializing operation and a refresh operation and is disabled by sensing a logic level of the second internal chip select signal during the initializing operation and the refresh operation, and generate an initialization signal which is enabled during an initializing operation period, in response to a reset signal and the buffer control signal.

In another embodiment, a semiconductor device may include a control circuit configured to generate a buffer control signal, which is enabled when entering an initializing operation and a refresh operation and is disabled when entering a normal operation; a first buffer circuit configured to generate a first internal chip select signal based on the buffer control signal when entering the normal operation; and a second buffer circuit configured to generate a second internal chip select signal based on the buffer control signal when entering the initialization operation and the refresh operation.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Various embodiments are directed to a semiconductor device in which a buffer to be inputted with a chip select signal (CS) in an initializing operation and a refresh operation is changed from a differential amplification circuit to a CMOS.

According to the embodiments, since a buffer to be inputted with a chip select signal (CS) in an initializing operation and a refresh operation is changed from a differential amplification circuit to a CMOS, current consumption may be reduced.

Also, according to the embodiments, by securing an enable period of an initialization signal from a time when a reset signal for performing the initializing operation is inputted, to after a set period, it is possible to stably perform the initializing operation.

Figure 1:
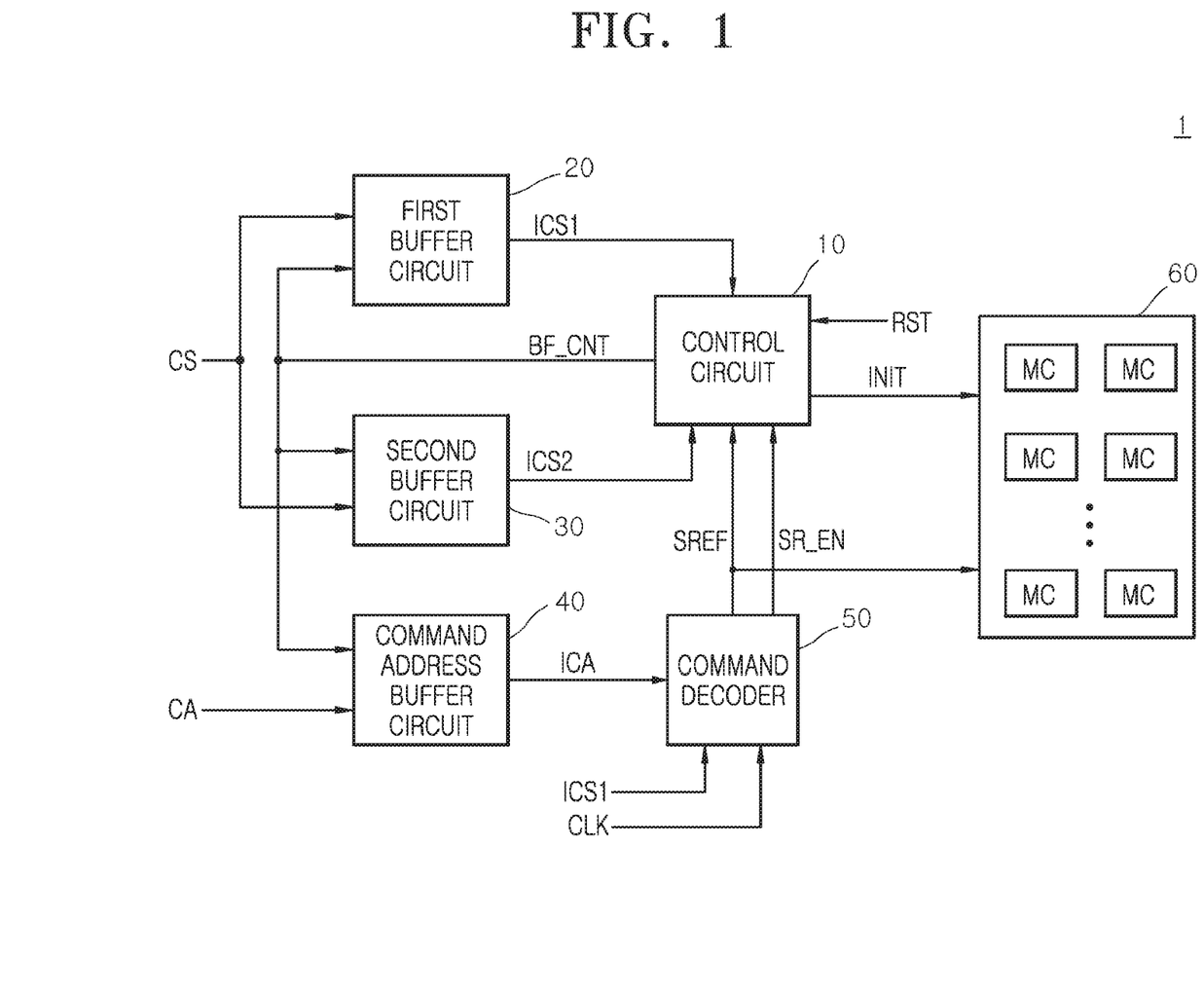
FIG. 1 is a block diagram illustrating a representation of an example of the configuration of a semiconductor device in accordance with an embodiment of the disclosure.

As illustrated in FIG. 1, a semiconductor device 1, in accordance with an embodiment of the disclosure, may include a control circuit 10, a first buffer circuit 20, a second buffer circuit 30, a command address buffer circuit 40, a command decoder 50 and a core circuit 60.

The control circuit 10 may generate a buffer control signal BF_CNT, which is enabled when entering an initializing operation. The buffer control signal BF_CNT is disabled by sensing the logic level of a second internal chip select signal ICS2 during the initializing operation. The control circuit 10 may also generate the buffer control signal BF_CNT, which is enabled in response to a reset signal RST. The buffer control signal BF_CNT may be disabled by sensing the logic level of the second internal chip select signal ICS2. The control circuit 10 may also generate the buffer control signal BF_CNT, which is enabled when entering a refresh operation. The buffer control signal BF_CNT may be disabled by sensing the logic level of the second internal chip select signal ICS2 during the refresh operation. The control circuit 10 may also generate the buffer control signal BF_CNT, which is enabled in response to a refresh enable signal SR_EN. The buffer control signal BF_CNT may be disabled by sensing the logic level of the second internal chip select signal ICS2 during the refresh operation. The reset signal RST may be set as a signal which is enabled for the initializing operation. The refresh enable signal SR_EN may be set as a pulse signal, which is generated when entering the refresh operation.

The control circuit 10 may generate an initialization signal INIT which is enabled during an initializing operation period, in response to the reset signal RST and a first internal chip select signal ICS1. The control circuit 10 may generate the initialization signal INIT, which is enabled at a time when the reset signal RST is inputted. The initialization signal INIT may be disabled after a set time from a time when the first internal chip select signal ICS1 is inputted. The set time may be set to three cycles of a clock CLK, and may be set to various times depending on an embodiment. The detailed configuration and operation of the control circuit 10 will be described later with reference to FIGS. 2 to 5.

The first buffer circuit 20 may generate the first internal chip select signal ICS1 in response to the buffer control signal BF_CNT and a chip select signal CS. The first buffer circuit 20 may generate the first internal chip select signal ICS1 by buffering the chip select signal CS in a state in which the buffer control signal BF_CNT has a preset logic level. The chip select signal CS may be a command which is enabled to select a chip (not illustrated), including the semiconductor device 1. According to an embodiment, the first buffer circuit 20 may buffer a command other than the chip select signal CS. The buffer control signal BF_CNT may have a logic high level (a first logic level) in a normal operation and have a logic low level (a second logic level) in the initializing operation and the refresh operation. The normal operation means the operation besides the low power consumption operations such as the initializing operation and the refresh operation. Each of the first logic level and the second logic level may be set to a logic high level or a logic low level, depending on an embodiment. The first buffer circuit 20 may generate the first internal chip select signal ICS1 by buffering the chip select signal CS during the normal operation. The first buffer circuit 20 may be realized by a differential amplification circuit. The detailed configuration and operation of the first buffer circuit 20 will be described later with reference to FIG. 6.

The second buffer circuit 30 may generate the second internal chip select signal ICS2 in response to the buffer control signal BF_CNT and the chip select signal CS. The second buffer circuit 30 may generate the second internal chip select signal ICS2 by buffering the chip select signal CS in a state in which the buffer control signal BF_CNT is disabled. According to an embodiment, the second buffer circuit 30 may buffer an external command other than the chip select signal CS. The second buffer circuit 30 may generate the second internal chip select signal ICS2 by buffering the chip select signal CS during the initializing operation and the refresh operation. The second buffer circuit 30 may be realized by a CMOS (complementary metal oxide semiconductor). The detailed configuration and operation of the second buffer circuit 30 will be described later with reference to FIG. 7.

The command address buffer circuit 40 may generate an internal command address ICA in response to the buffer control signal BF_CNT and a command address CA. The command address buffer circuit 40 may generate the internal command address ICA by buffering the command address CA in a state in which the buffer control signal BF_CNT has a preset logic level. The command address CA may include at least one of a command and an address. The command and/or address, included in the command address CA, may be transmitted through separate lines or common lines. The command address CA may include a plurality of bits, depending on an embodiment. The command address buffer circuit 40 may generate the internal command address ICA by buffering the command address CA during the normal operation. The command address buffer circuit 40 may be realized by a differential amplification circuit. The detailed configuration and operation of the command address buffer circuit 40 will be described later with reference to FIG. 8.

The command decoder 50 may generate a refresh signal SREF which is enabled during a refresh operation period, in synchronization with the clock CLK, in response to the first internal chip select signal ICS1 and the internal command address ICA. The command decoder 50 may generate the refresh enable signal SR_EN as a pulse signal, which is generated when entering the refresh operation, in synchronization with the clock CLK, in response to the first internal chip select signal ICS1 and the internal command address ICA.

The core circuit 60 may include a plurality of memory cells MC. The core circuit 60 may perform the initializing operation for the plurality of memory cells MC during a period in which the initialization signal INIT is enabled. The core circuit 60 may perform the refresh operation for the plurality of memory cells MC, during a period in which the refresh signal SREF is enabled. While the core circuit 60 is illustrated as a memory circuit including the plurality of memory cells MC, the core circuit 60 may include an internal circuit for performing the normal operation.

Figure 2:
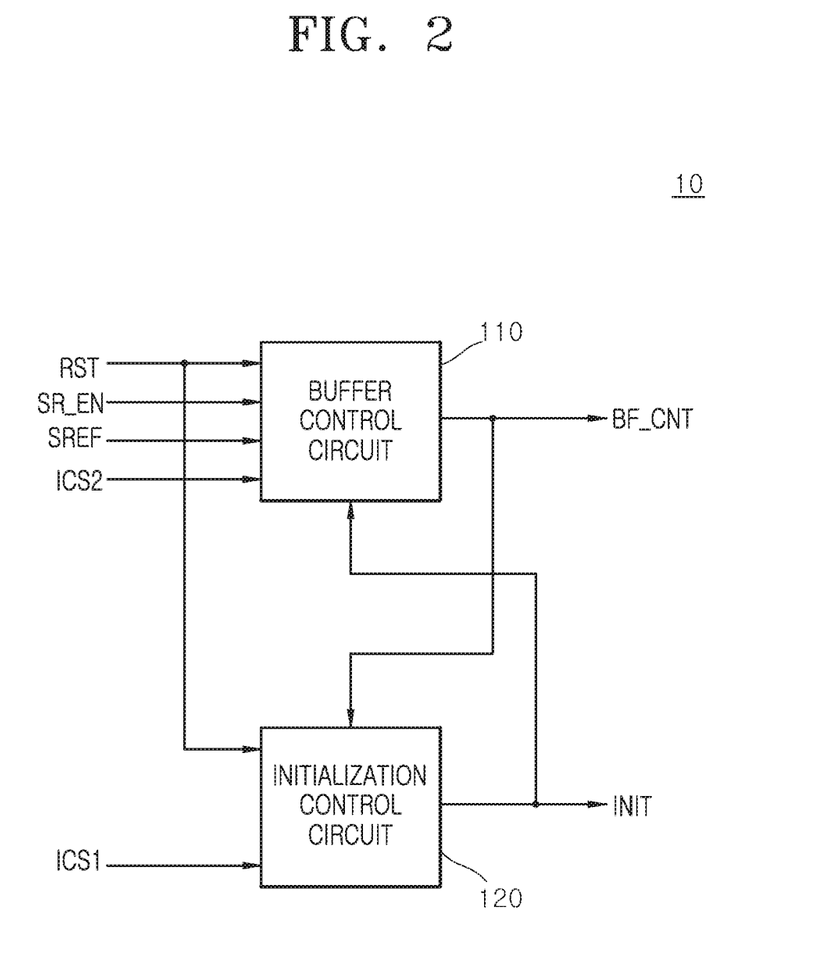
FIG. 2 is a block diagram illustrating a representation of an example of the configuration of the control circuit included in the semiconductor device illustrated in FIG. 1.

Referring to FIG. 2, the control circuit 10 may include a buffer control circuit 110 and an initialization control circuit 120.

The buffer control circuit 110 may generate the buffer control signal BF_CNT, which is enabled in response to the reset signal RST. The buffer control circuit 110 may be disabled by sensing the logic level of the second internal chip select signal ICS2. The buffer control circuit 110 may generate the buffer control signal BF_CNT, which is enabled in response to the refresh enable signal SR_EN. The buffer control circuit 110 may be disabled by sensing the logic level of the second internal chip select signal ICS2. The buffer control circuit 110 may generate the buffer control signal BF_CNT, which is enabled in response to the reset signal RST and the refresh enable signal SR_EN. The buffer control circuit 110 may be disabled by the initialization signal INIT and the refresh signal SREF when the second internal chip select signal ICS2 is generated at a logic high level (a first logic level). The detailed configuration and operation of the buffer control circuit 110 will be described later with reference to FIGS. 3 and 4.

The initialization control circuit 120 may generate the initialization signal INIT which is enabled in response to the reset signal RST and is disabled in response to the first internal chip select signal ICS1. The initialization control circuit 120 may generate the initialization signal INIT which is enabled at a time when the reset signal RST is inputted and is disabled after a set time elapses from a time when the first internal chip select signal ICS1 is generated at a logic low level (a second logic level). The detailed configuration and operation of the initialization control circuit 120 will be described later with reference to FIG. 5.

Figure 3:
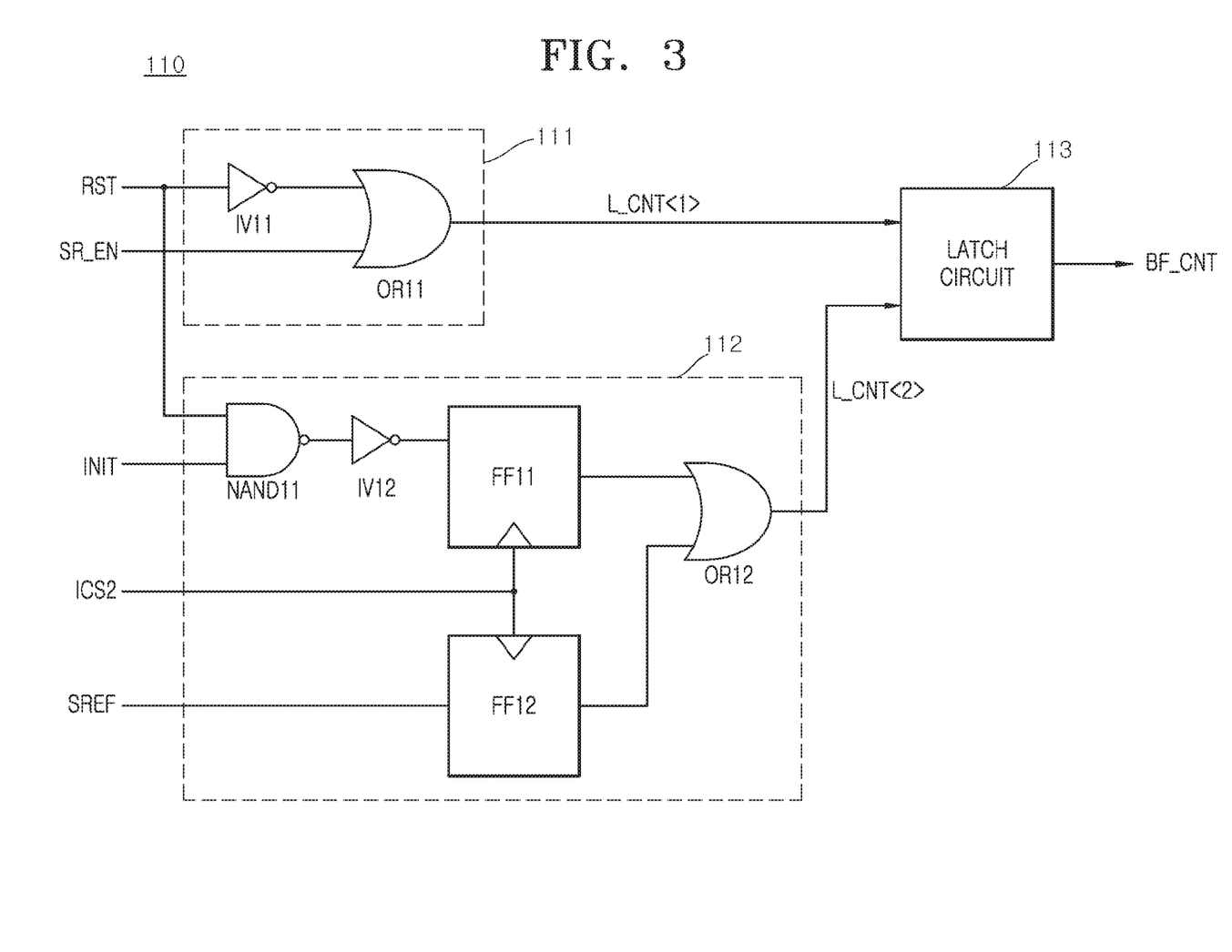
FIG. 3 is a diagram illustrating a representation of an example of the configuration of the buffer control circuit included in the control circuit illustrated in FIG. 2.

Referring to FIG. 3, the buffer control circuit 110 may include a first latch control signal generation circuit 111, a second latch control signal generation circuit 112 and a latch circuit 113.

The first latch control signal generation circuit 111 may be configured to perform an inversion operation and an OR operation. For example, the first latch control signal generation circuit 111 may include an inverter IV11 and an OR gate OR11. The first latch control signal generation circuit 111 may generate a first latch control signal L_CNT<1>, which is enabled in response to the reset signal RST and the refresh enable signal SR_EN. The first latch control signal generation circuit 111 may generate the first latch control signal L_CNT<1>, which is enabled when the reset signal RST is enabled to a logic low level (a second logic level). The first latch control signal generation circuit 111 may generate the first latch control signal L_CNT<1>, which is enabled when the refresh enable signal SR_EN is enabled to a logic high level (a first logic level).

The second latch control signal generation circuit 112 may be configured to perform a NAND operation, an inversion operation, flip-flop operations, and an OR operation. For example, the second latch control signal generation circuit 112 may include a NAND gate NAND11, an inverter IV12, flip-flops FF11 and FF12 and an OR gate OR12. The second latch control signal generation circuit 112 may generate a second latch control signal L_CNT<2> from the initialization signal INIT and the refresh signal SREF in synchronization with the second internal chip select signal ICS2. The second latch control signal generation circuit 112 may generate the second latch control signal L_CNT<2> from the reset signal RST, the initialization signal INIT, and the refresh signal SREF when the second internal chip select signal ICS2 is enabled to a logic high level (a first logic level). The second latch control signal generation circuit 112 may generate the second latch control signal L_CNT<2> of a logic high level (a first logic level) when the reset signal RST is at a logic high level (a first logic level) and the initialization signal INIT is at a logic high level (a first logic level) when the second internal chip select signal ICS2 is enabled to a logic high level (a first logic level). The second latch control signal generation circuit 112 may generate the second latch control signal L_CNT<2> of a logic high level (a first logic level) when the refresh signal SREF is at a logic high level (a first logic level) when the second internal chip select signal ICS2 is enabled to a logic high level (a first logic level).

The latch circuit 113 may generate the buffer control signal BF_CNT, which is enabled in response to the first latch control signal L_CNT<1>. The latch circuit 113 may be disabled in response to the second latch control signal L_CNT<2>. The latch circuit 113 may generate the buffer control signal BF_CNT, which is enabled when the first latch control signal L_CNT<1> is enabled to a logic high level (a first logic level) and is disabled when the second latch control signal L_CNT<2> is enabled to a logic high level (a first logic level). The detailed configuration and operation of the latch circuit 113 will be described below with reference to FIG. 4.

Figure 4:
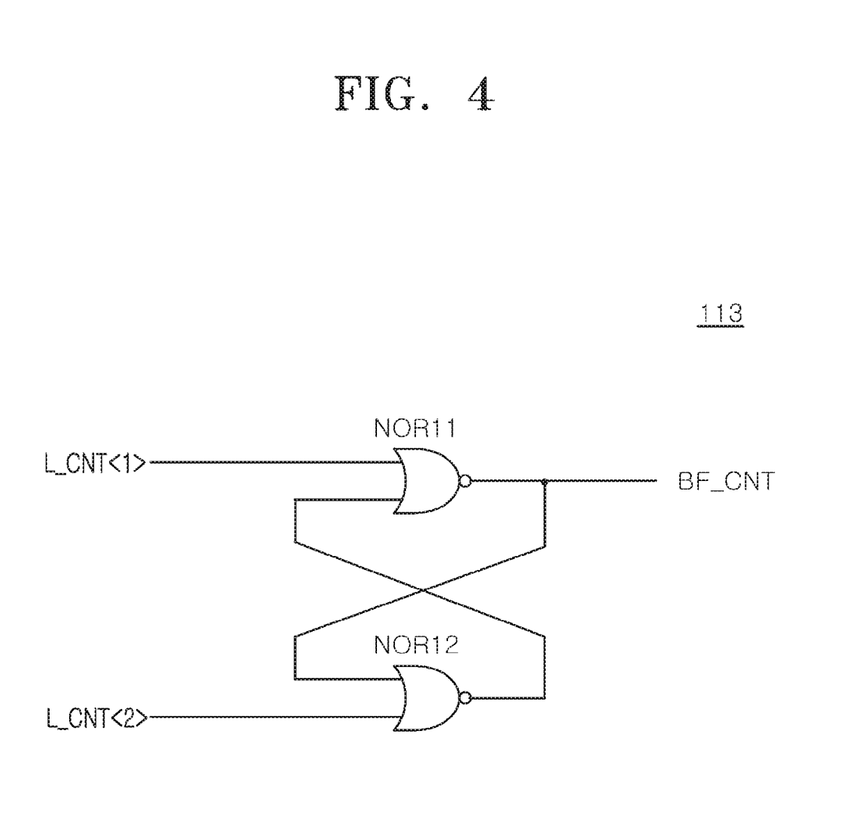
FIG. 4 is a circuit diagram illustrating a representation of an example of the latch circuit included in the buffer control circuit illustrated in FIG. 3.

Referring to FIG. 4, the latch circuit 113 may be configured to perform NOR operations. For example, the latch circuit 113 may include NOR gates NOR11 and NOR12.

The NOR gate NOR11 may generate the buffer control signal BF_CNT, which is enabled to a logic low level (a second logic level) when the first latch control signal L_CNT<1> is enabled to a logic high level (a first logic level). The NOR gate NOR11 may generate the buffer control signal BF_CNT, which is disabled to a logic high level (a first logic level) when the first latch control signal L_CNT<1> is at a logic low level (a second logic level) and the output signal of the NOR gate NOR12 is at a logic low level (a second logic level).

The NOR gate NOR12 may generate the output signal of a logic low level (a second logic level), when the second latch control signal L_CNT<2> is enabled to a logic high level (a first logic level).

Figure 5:
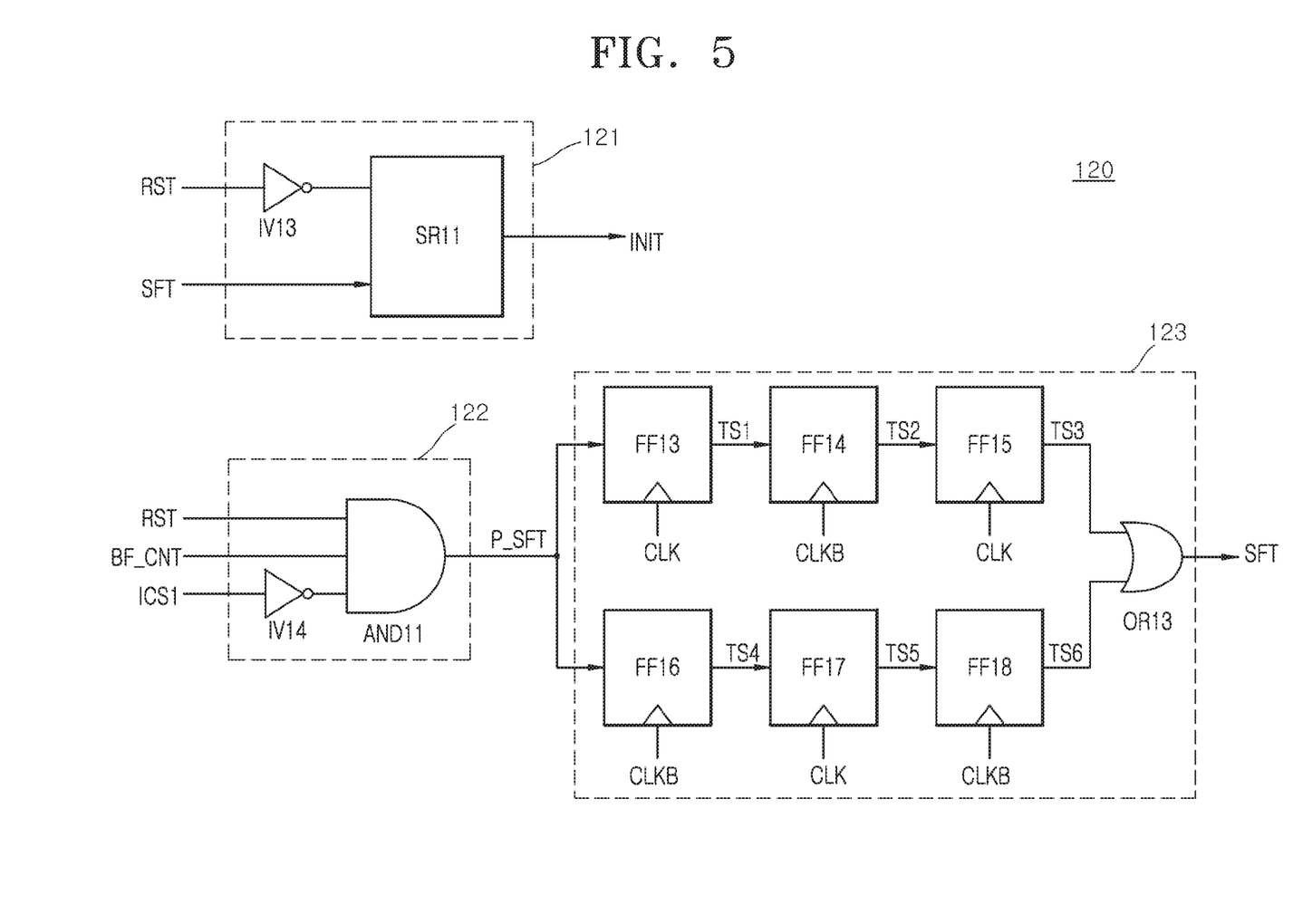
FIG. 5 is a diagram illustrating a representation of an example of the configuration of the initialization control circuit included in the control circuit illustrated in FIG. 2.

Referring to FIG. 5, the initialization control circuit 120 may include an initialization signal generation circuit 121, a pre-shifting signal generation circuit 122 and a shifting circuit 123.

The initialization signal generation circuit 121 may be configured to perform an inversion operation and an SR latch operation. For example, the initialization signal generation circuit 121 may include an inverter IV3 and an SR latch SR11. The initialization signal generation circuit 121 may generate the initialization signal INIT, which is enabled in response to the reset signal RST and is disabled in response to a shifting signal SFT. The initialization signal generation circuit 121 may generate the initialization signal INIT, which is enabled to a logic high level (a first logic level) when the reset signal RST is enabled to a logic low level (a second logic level).

The initialization signal generation circuit 121 may generate the initialization signal INIT, which is disabled to a logic low level (a second logic level) when the shifting signal SFT is enabled to a logic high level (a first logic level). Since the SR latch SR11 is based on the same circuit and performs the same operation as the latch circuit 113, illustrated in FIG. 4, with only the input/output signals being different, detailed description thereof will be omitted herein.

The pre-shifting signal generation circuit 122 may be configured to perform an inversion operation and an AND operation. For example, the pre-shifting signal generation circuit 122 may include an inverter IV14 and an AND gate AND11. The pre-shifting signal generation circuit 122 may generate a pre-shifting signal P_SFT depending on the logic levels of the reset signal RST, the buffer control signal BF_CNT and the first internal chip select signal ICS1. The pre-shifting signal generation circuit 122 may generate the pre-shifting signal P_SFT, which is enabled to a logic high level (a first logic level) when the reset signal RST is at a logic high level (a first logic level), the buffer control signal BF_CNT is at a logic high level (a first logic level), and the first internal chip select signal ICS1 is at a logic low level (a second logic level).

The shifting circuit 123 may be configured to perform flip-flop operations and an OR operation. For example, the shifting circuit 123 may include flip-flops FF13, FF14, FF15, FF16, FF17 and FF18 and an OR gate OR13.

The flip-flop FF13 may generate a first transfer signal TS1 by latching the pre-shifting signal P_SFT in synchronization with the rising edge of the clock CLK. The flip-flop FF14 may generate a second transfer signal TS2 by latching the first transfer signal TS1 in synchronization with the rising edge of an inverted clock CLKB. The flip-flop FF15 may generate a third transfer signal TS3 by latching the second transfer signal TS2 in synchronization with the rising edge of the clock CLK. The flip-flop FF16 may generate a fourth transfer signal TS4 by latching the pre-shifting signal P_SFT in synchronization with the rising edge of the inverted clock CLKB. The flip-flop FF17 may generate a fifth transfer signal TS5 by latching the fourth transfer signal TS4 in synchronization with the rising edge of the clock CLK. The flip-flop FF18 may generate a sixth transfer signal TS6 by latching the fifth transfer signal TS5 in synchronization with the rising edge of the inverted clock CLKB. The OR gate OR13 may generate the shifting signal SFT which is enabled to a logic high level (a first logic level), when any one of the third transfer signal TS3 and the sixth transfer signal TS6 is at a logic high level (a first logic level).

That is to say, the shifting circuit 123 may generate the shifting signal SFT by shifting the pre-shifting signal P_SFT by the three cycles of the clock CLK. The clock CLK may be set as a signal which cyclically toggles to synchronize the operation of the semiconductor device 1. The inverted clock CLKB may be set as a signal which is generated by inverting the clock CLK.

Figure 6:
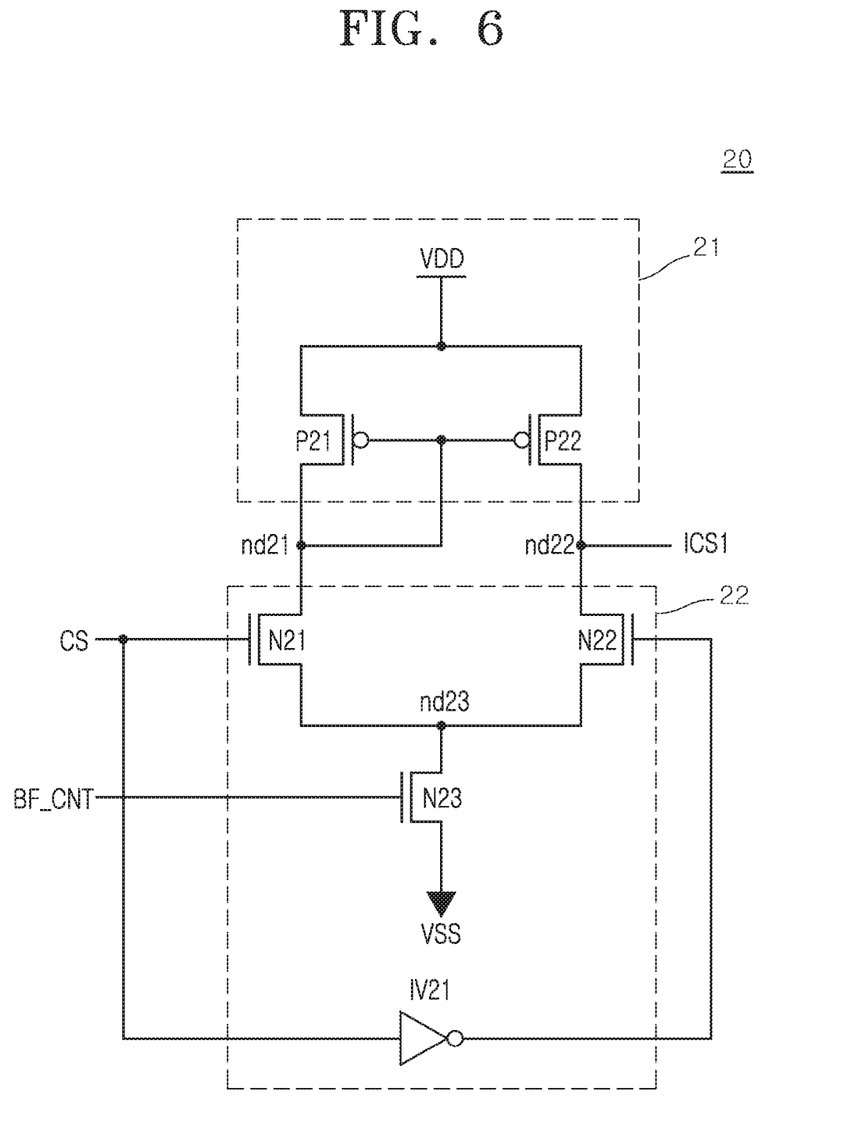
FIG. 6 is a circuit diagram illustrating a representation of an example of the first buffer circuit included in the semiconductor device illustrated in FIG. 1.

Referring to FIG. 6, the first buffer circuit 20 may include a first current mirror 21 and a first charge emitter 22.

The first current mirror 21 may operate as a constant current source by including PMOS transistors P21 and P22. The PMOS transistor P21 may be coupled between a power supply voltage VDD and a node nd21, and may be turned on in response to the voltage of the node nd21. The PMOS transistor P22 may be coupled between the power supply voltage VDD and a node nd22, and may be turned on in response to the voltage of the node nd21.

The first charge emitter 22 may include NMOS transistors N21, N22 and N23 and may be configured to perform an inversion operation. For example, the first charge emitter 22 may also include an inverter IV21. The NMOS transistor N21 may be coupled between the node nd21 and a node nd23, and may be turned on in response to the chip select signal CS. The inverter IV21 may invert and buffer the chip select signal CS, and may output an output signal. The NMOS transistor N22 may be coupled between the node nd22 and the node nd23, and may be turned on in response to the output signal of the inverter IV21. The NMOS transistor N23 may be coupled between the node nd23 and a ground voltage VSS, and may be turned on in response to the buffer control signal BF_CNT. The first charge emitter 22 may generate the first internal chip select signal ICS1 which is driven to a logic high level (a first logic level), by emitting a larger amount of charges through the node nd21 than through the node nd22, when the chip select signal CS is at a logic high level (a first logic level) with the buffer control signal BF_CNT being at a logic high level (a first logic level). The first charge emitter 22 may generate the first internal chip select signal ICS1 which is driven to a logic low level (a second logic level), by emitting a larger amount of charges through the node nd22 than through the node nd21, when the chip select signal CS is at a logic low level (a second logic level) with the buffer control signal BF_CNT being at a logic high level (a first logic level).

Figure 7:
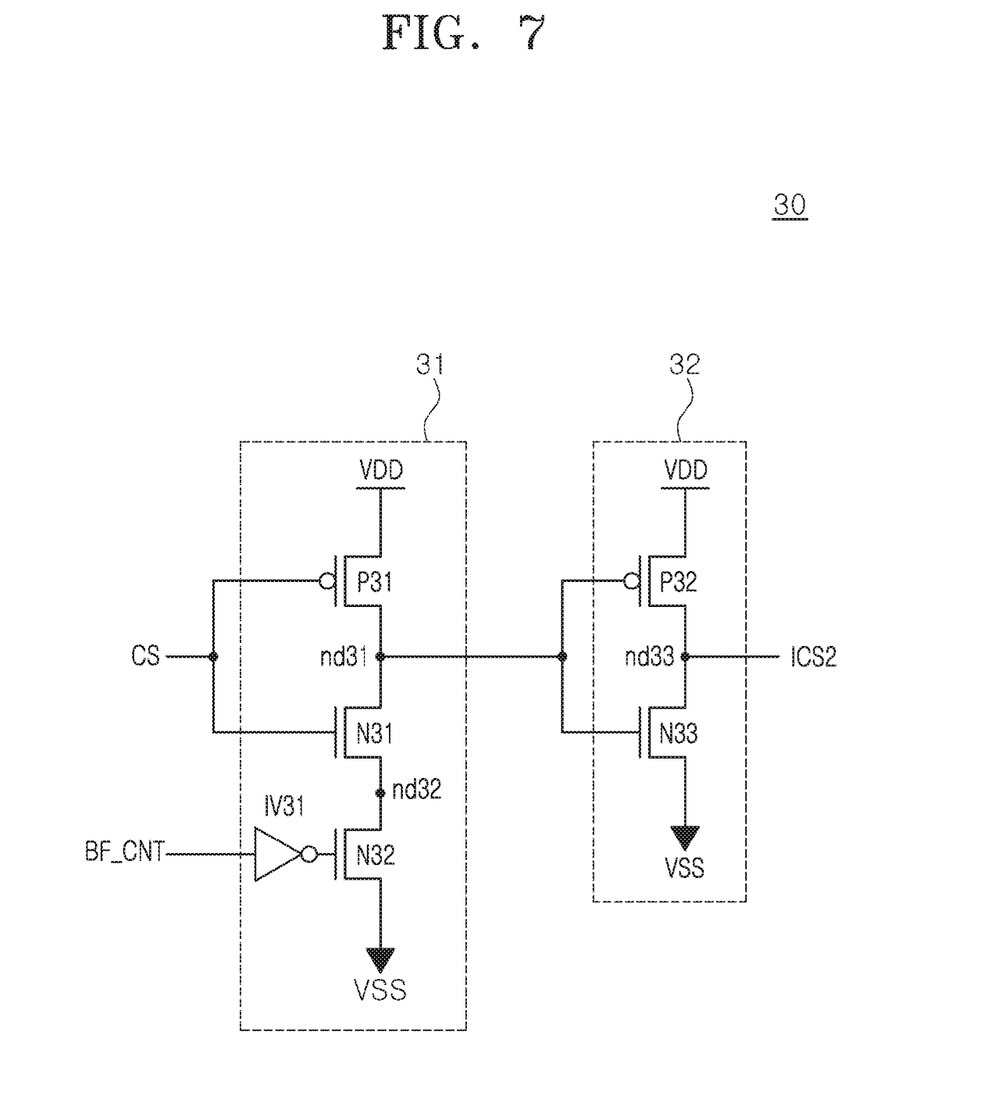
FIG. 7 is a circuit diagram illustrating a representation of an example of the second buffer circuit included in the semiconductor device illustrated in FIG. 1.

Referring to FIG. 7, the second buffer circuit 30 may include an input driver 31 and an output driver 32.

The input driver 31 may include a PMOS transistor P31, NMOS transistors N31 and N32 and an inverter IV31. The PMOS transistor P31 may be coupled between the power supply voltage VDD and a node nd31, and may be turned on in response to the chip select signal CS. The PMOS transistor P31 may be turned on when the chip select signal CS of a logic low level (a second logic level) is inputted, and thereby, may pull-up drive the node nd31 to the power supply voltage VDD. The NMOS transistor N31 may be coupled between the node nd31 and a node nd32, and may be turned on in response to the chip select signal CS. The NMOS transistor N31 may be turned on to pull-down drive the node nd31 to the ground voltage VSS, when the chip select signal CS of a logic high level (a first logic level) is inputted. The NMOS transistor N32 may be coupled between the node nd32 and the ground voltage VSS, and may be turned on in response to the output signal of the inverter IV31 which inverts and buffers the buffer control signal BF_CNT. The NMOS transistor N32 may be turned on when the buffer control signal BF_CNT is at a logic low level (a second logic level), and thereby, may pull-down drive the node nd32 to the ground voltage VSS.

The output driver 32 may include a PMOS transistor P32 and an NMOS transistor N33. The PMOS transistor P32 may be coupled between the power supply voltage VDD and a node nd33, and may be turned on in response to the signal of the node nd31. The PMOS transistor P32 may be turned on when the signal of the node nd31, which is at a logic low level (a second logic level), is inputted. The PMOS transistor P32 may pull-up drive the node nd33, through which the second internal chip select signal ICS2 is outputted, to the power supply voltage VDD. The NMOS transistor N33 may be coupled between the node nd33 and the ground voltage VSS, and may be turned on in response to the signal of the node nd31. The NMOS transistor N33 may be turned on when the signal of the node nd31 is at a logic high level (a first logic level). The NMOS transistor N33 may pull-down drive the node nd33, through which the second internal chip select signal ICS2 is outputted, to the ground voltage VSS.

Figure 8:
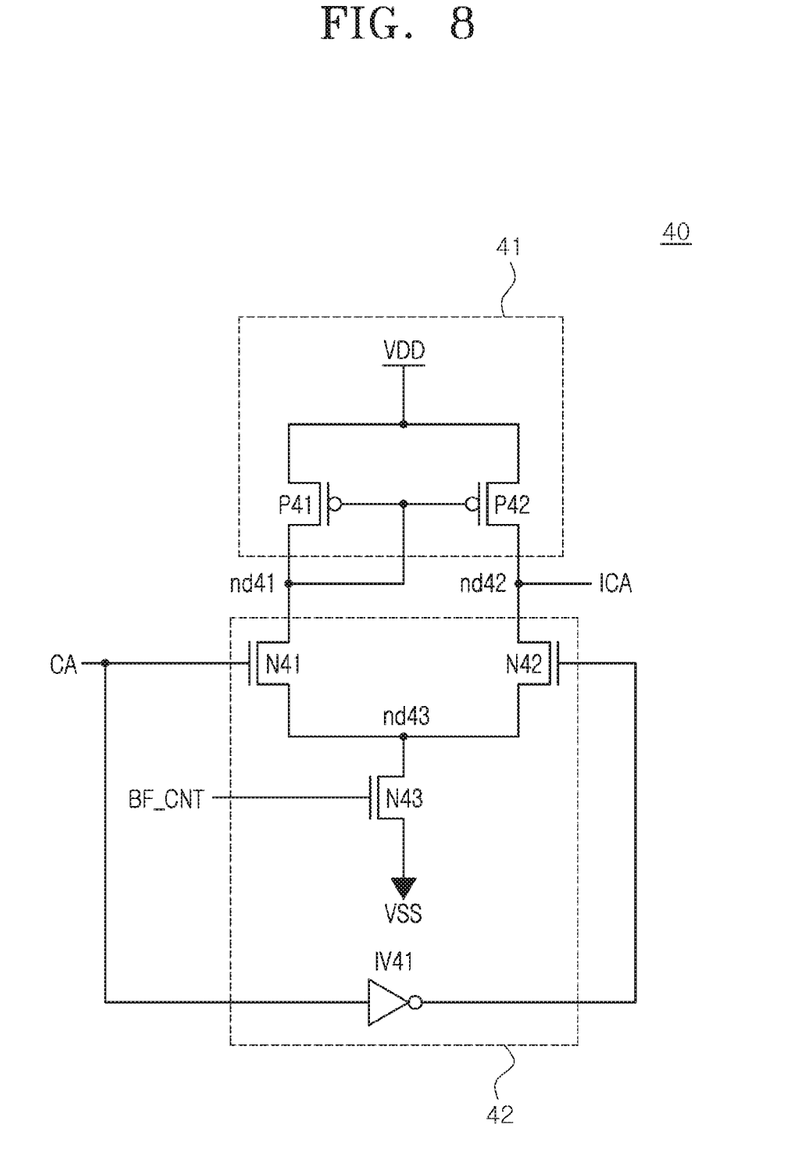
FIG. 8 is a circuit diagram illustrating a representation of an example of the command address buffer circuit included in the semiconductor device illustrated in FIG. 1.

Referring to FIG. 8, the command address buffer circuit 40 may include a second current mirror 41 and a second charge emitter 42.

The second current mirror 41 may operate as a constant current source by including PMOS transistors P41 and P42. The PMOS transistor P41 may be coupled between the power supply voltage VDD and a node nd41, and may be turned on in response to the voltage of the node nd41. The PMOS transistor P42 may be coupled between the power supply voltage VDD and a node nd42, and may be turned on in response to the voltage of the node nd41.

The second charge emitter 42 may include NMOS transistors N41, N42 and N43 and an inverter IV41. The NMOS transistor N41 may be coupled between the node nd41 and a node nd43, and may be turned on in response to the command address CA. The inverter IV41 may invert and buffer the command address CA, and may output an output signal. The NMOS transistor N42 may be coupled between the node nd42 and the node nd43, and may be turned on in response to the output signal of the inverter IV41. The NMOS transistor N43 may be coupled between the node nd43 and the ground voltage VSS, and may be turned on in response to the buffer control signal BF_CNT. The second charge emitter 42 may generate the internal command address ICA which is driven to a logic high level (a first logic level), by emitting a larger amount of charges through the node nd41 than through the node nd42, when the command address CA is at a logic high level (a first logic level) with the buffer control signal BF_CNT being at a logic high level (a first logic level). The second charge emitter 42 may generate the internal command address ICA which is driven to a logic low level (a second logic level), by emitting a larger amount of charges through the node nd42 than through the node nd41, when the command address CA is at a logic low level (a second logic level) with the buffer control signal BF_CNT being at a logic high level (a first logic level).

Figure 9:
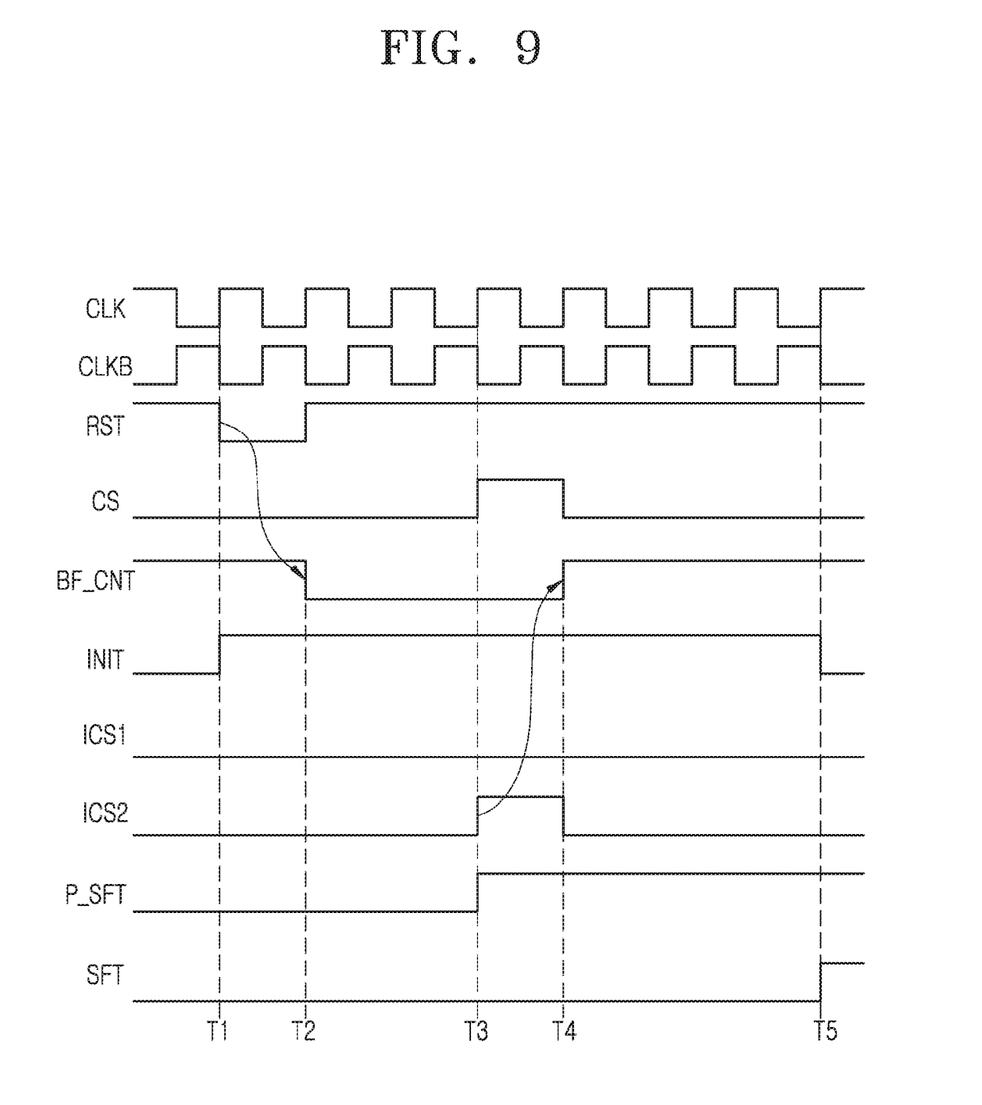
FIGS. 9 and 10 are representations of examples of timing diagrams to assist in the explanation of operations of the semiconductor device in accordance with the embodiment of the disclosure.

The initializing operation of the semiconductor device 1 in accordance with the embodiment of the disclosure will be described below with reference to FIG. 9.

At a time T1, the reset signal RST is inputted in synchronization with the rising edge of the clock CLK.

The initialization signal generation circuit 121 of the initialization control circuit 120 generates the initialization signal INIT, which is enabled to a logic high level (a first logic level), in response to the reset signal RST of a logic low level (a second logic level).

The core circuit 60 enters the initializing operation by receiving the initialization signal INIT of a logic high level (a first logic level), and performs the initializing operation for the plurality of memory cells MC.

At a time T2, the buffer control circuit 110 generates the buffer control signal BF_CNT, which is enabled to a logic low level (a second logic level), by the reset signal RST inputted at a logic low level (a second logic level) at the time T1. At this time, the second buffer circuit 30 is enabled by the buffer control signal BF_CNT which is enabled to a logic low level (a second logic level), and the first buffer circuit 20 and the command address buffer circuit 40 are disabled.

At a time T3, the chip select signal CS is inputted at a logic high level (a first logic level).

The second buffer circuit 30 generates the second internal chip select signal ICS2 of a logic high level (a first logic level) by the buffer control signal BF_CNT enabled to a logic low level (a second logic level) and the chip select signal CS of a logic high level (a first logic level).

At a time T4, the buffer control circuit 110 generates the buffer control signal BF_CNT, which is disabled to a logic high level (a first logic level), by sensing the logic level of the second internal chip select signal ICS2, which is generated to a logic high level (a first logic level) at the time T3. At this time, the first buffer circuit 20 and the command address buffer circuit 40 are enabled by the buffer control signal BF_CNT, which is disabled to a logic high level (a first logic level), and the second buffer circuit 30 is disabled.

The pre-shifting signal generation circuit 122 of the initialization control circuit 120 generates the pre-shifting signal P_SFT according to the reset signal RST of a logic high level (a first logic level), the buffer control signal BF_CNT of a logic high level (a first logic level) and the first internal chip select signal ICS1 of a logic low level (a second logic level).

At a time T5, the shifting circuit 123 of the initialization control circuit 120 generates the shifting signal SFT by shifting the pre-shifting signal P_SFT by the three cycles of the clock CLK.

The initialization signal generation circuit 121 of the initialization control circuit 120 generates the initialization signal INIT, which is disabled by the shifting signal SFT of a logic high level (a first logic level).

The core circuit 60 performs the initializing operation from the time T1 to the time T5. The inverted clock CLKB illustrated in FIG. 9 is a signal which is generated by inverting the clock CLK, and the clock CLK and the inverted clock CLKB may be set to have opposite phases to each other.

Figure 10:
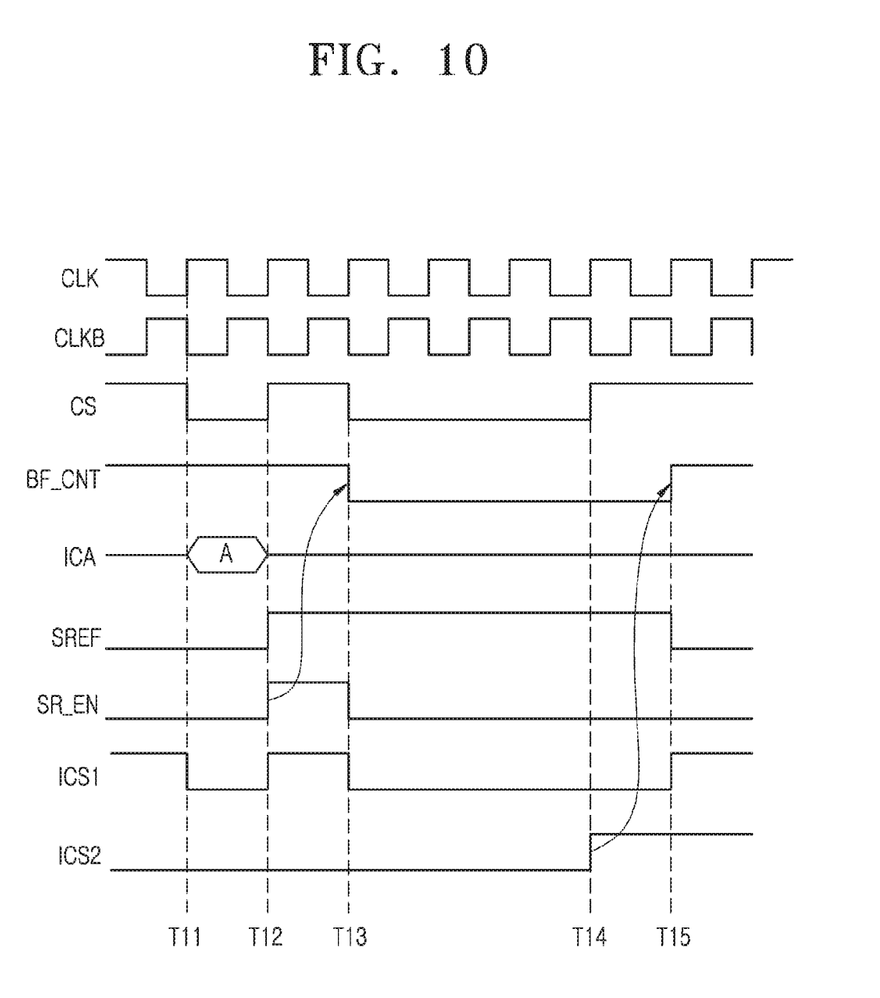

The refresh operation of the semiconductor device 1 in accordance with the embodiment of the disclosure will be described below with reference to FIG. 10.

Before the description, in the normal operation, the buffer control signal BF_CNT is generated at a logic high level (a first logic level), and thereby, the first buffer circuit 20 and the command address buffer circuit 40 are enabled.

At a time T11, the chip select signal CS is inputted at a logic low level (a second logic level) in synchronization with the rising edge of the clock CLK. The command address CA is inputted at an 'A' combination for the refresh operation.

The first buffer circuit 20 generates the first internal chip select signal ICS1 of a logic low level (a second logic level) by buffering the chip select signal CS by the buffer control signal BF_CNT of a logic high level (a first logic level).

The command address buffer circuit 40 buffers the command address CA by receiving the buffer control signal BF_CNT of a logic high level (a first logic level), and thereby generating the internal command address ICA of an 'A' combination.

At a time T12, the command decoder 50 generates the refresh signal SREF, which is enabled during the refresh operation period by the first internal chip select signal ICS1 and the internal command address ICA of the time T11 in synchronization with the clock CLK. The command decoder 50 generates the refresh enable signal SR_EN as a pulse signal, which is generated when entering the refresh operation by the first internal chip select signal ICS1 and the internal command address ICA of the time T11 in synchronization with the clock CLK.

At a time T13, the buffer control circuit 110 generates the buffer control signal BF_CNT, which is enabled to a logic low level (a second logic level) in response to the refresh enable signal SR_EN generated to a logic high level (a first logic level) at the time T12. At this time, the second buffer circuit 30 is enabled by the buffer control signal BF_CNT, which is enabled to a logic low level (a second logic level), and the first buffer circuit 20 and the command address buffer circuit 40 are disabled.

At a time T14, the chip select signal CS is inputted at a logic high level (a first logic level) in synchronization with the rising edge of the clock CLK.

The second buffer circuit 30 generates the second internal chip select signal ICS2 of a logic high level (a first logic level) by buffering the chip select signal CS by the buffer control signal BF_CNT of a logic low level (a second logic level).

At a time T15, the buffer control circuit 110 generates the buffer control signal BF_CNT, which is disabled to a logic high level (a first logic level) by sensing the second internal chip select signal ICS2 which is generated to a logic high level (a first logic level) at the time T14. At this time, the second buffer circuit 30 is disabled by the buffer control signal BF_CNT, which is disabled to a logic high level (a first logic level), and the first buffer circuit 20 and the command address buffer circuit 40 are enabled. The inverted clock CLKB illustrated in FIG. 10 is a signal which is generated by inverting the clock CLK, and the clock CLK and the inverted clock CLKB may be set to have opposite phases to each other.

In the semiconductor device according to the embodiment, since a buffer to which the chip select signal CS is to be inputted in the initializing operation and the refresh operation is changed from a differential amplification circuit to a CMOS, current consumption may be reduced. Also, in the semiconductor device according to the embodiment, by securing an enable period of an initialization signal from a time when a reset signal for performing the initializing operation is inputted, to after a set period, it is possible to stably perform the initializing operation.

The semiconductor device 1 described above with reference to FIGS. 1 to 10 may be applied to an electronic system which includes a memory system, a graphic system, a computing system, a mobile system or the like. For example, referring to FIG. 11, an electronic system 1000 in accordance with an embodiment of the disclosure may include a data storage 1001, a memory controller 1002, a buffer memory 1003 and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor device 1 illustrated in FIGS. 1 to 10. The data storage 1001 may include a nonvolatile memory capable of not losing and continuously storing data even though power supply is interrupted. The nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 11, a controller for controlling the data storage 1001 and a controller for controlling the buffer memory 1003 as a volatile memory may be independently configured in the memory controller 1002.

Figure 11:
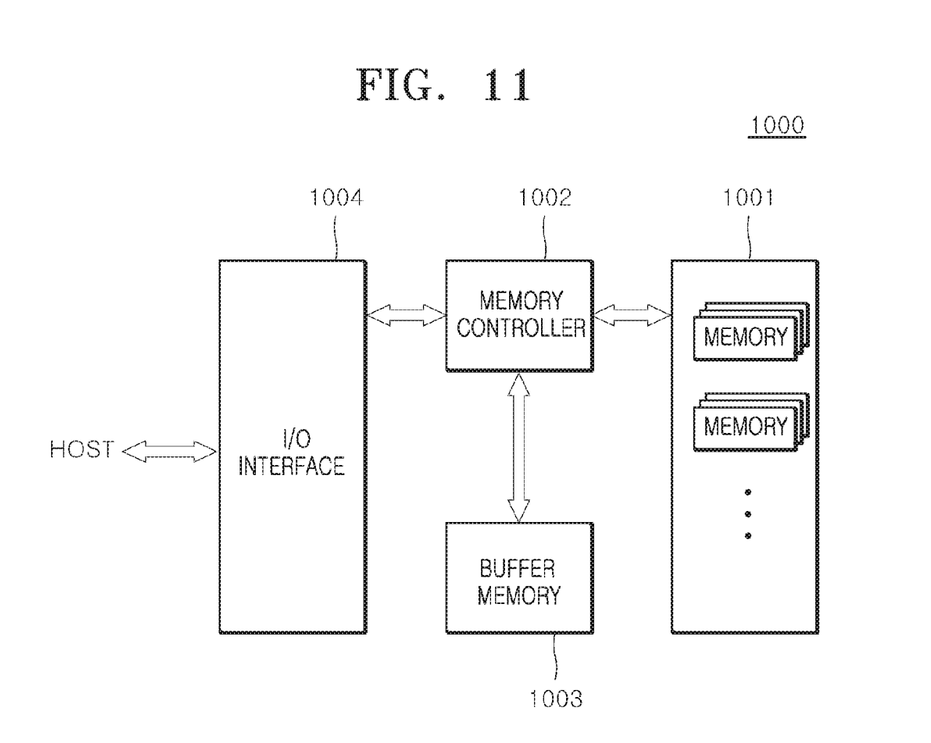
FIG. 11 is a diagram illustrating a representation of an example of the configuration of an electronic system to which a semiconductor device is applied, in accordance with an embodiment.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
   a first buffer circuit configured to generate a first internal chip select signal by buffering a chip select signal in response to a buffer control signal; and
   a second buffer circuit configured to generate a second internal chip select signal by buffering the chip select signal in response to the buffer control signal; and
   a control circuit configured to generate the buffer control signal by sensing logic levels of a reset signal and the second internal chip select signal, and generate an initialization signal, which is enabled during an initializing operation period, in response to the reset signal and the buffer control signal.

2. The semiconductor device according to claim 1, wherein the reset signal is a signal which is enabled to enter an initializing operation.

3. The semiconductor device according to claim 1, wherein the second buffer circuit is enabled during the initializing operation, and the first buffer circuit is enabled after the initializing operation.

4. The semiconductor device according to claim 1, wherein the control circuit comprises:
   a buffer control circuit configured to generate the buffer control signal which is enabled in response to the reset signal and is disabled by sensing a logic level of the second internal chip select signal; and
   an initialization control circuit configured to generate the initialization signal which is enabled in response to the reset signal and is disabled in response to the buffer control signal and the first internal chip select signal.

5. The semiconductor device according to claim 4, wherein the initialization signal is disabled after a time of shifting the buffer control signal by N cycles of a clock.

6. The semiconductor device according to claim 1, wherein the first buffer circuit comprises:
   a current mirror configured to supply current to a first node and a second node; and
   a charge emitter configured to generate the first internal chip select signal by differentially emitting charges of the first node and charges of the second node depending on logic levels of the buffer control signal and the chip select signal.

7. The semiconductor device according to claim 1, wherein the second buffer circuit comprises:
   an input driver configured to drive an input node in response to the buffer control signal and the chip select signal; and
   an output driver configured to drive an output node through which the second internal chip select signal is outputted, in response to a signal of the input node.

8. A semiconductor device comprising:
a first buffer circuit configured to generate a first internal chip select signal by buffering a chip select signal in response to a buffer control signal;
a second buffer circuit configured to generate a second internal chip select signal by buffering the chip select signal in response to the buffer control signal; and
a control circuit configured to generate the buffer control signal, which is enabled when entering an initializing operation and a refresh operation and is disabled by sensing a logic level of the second internal chip select signal during the initializing operation and the refresh operation, and configured to generate an initialization signal, which is enabled during an initializing operation period, in response to a reset signal and the buffer control signal.

9. The semiconductor device according to claim 8, wherein the second buffer circuit is enabled during the initializing operation and the refresh operation, and the first buffer circuit is enabled after the initializing operation and the refresh operation.

10. The semiconductor device according to claim 8, wherein the reset signal is a signal which is enabled to enter the initializing operation.

11. The semiconductor device according to claim 8, wherein the control circuit comprises:
a buffer control circuit configured to generate the buffer control signal which is enabled in response to the reset signal and a refresh enable signal and is disabled by sensing a logic level of the second internal chip select signal; and
an initialization control circuit configured to generate the initialization signal which is enabled in response to the reset signal and is disabled in response to the buffer control signal and the first internal chip select signal.

12. The semiconductor device according to claim 11, wherein the buffer control circuit comprises:
a first latch control signal generation circuit configured to generate a first latch control signal which is enabled in response to the reset signal and the refresh enable signal as a pulse signal which is generated when entering the refresh operation;
a second latch control signal generation circuit configured to generate a second latch control signal from the initialization signal and a refresh signal which is enabled during a refresh operation period, in synchronization with the second internal chip select signal; and
a latch circuit configured to generate the buffer control signal which is enabled in response to the first latch control signal and is disabled in response to the second latch control signal.

13. The semiconductor device according to claim 11, wherein the initialization control circuit comprises:
an initialization signal generation circuit configured to generate the initialization signal which is enabled in response to the reset signal and is disabled in response to a shifting signal;
a pre-shifting signal generation circuit configured to generate a pre-shifting signal depending on logic levels of the reset signal, the buffer control signal and the first internal chip select signal; and
a shifting circuit configured to generate the shifting signal by shifting the pre-shifting signal by N cycles of a clock.

14. The semiconductor device according to claim 8, wherein the first buffer circuit comprises:
a first current mirror configured to supply current to a first node and a second node; and
a first charge emitter configured to generate the first internal chip select signal by differentially emitting charges of the first node and charges of the second node depending on logic levels of the buffer control signal and the chip select signal.

15. The semiconductor device according to claim 8, wherein the second buffer circuit comprises:
an input driver configured to drive an input node in response to the buffer control signal and the chip select signal; and
an output driver configured to drive an output node through which the second internal chip select signal is outputted, in response to a signal of the input node.

16. The semiconductor device according to claim 8, further comprising:
a command address buffer circuit configured to generate an internal command address by buffering a command address in response to the buffer control signal;
a command decoder configured to generate the refresh signal which is enabled during the refresh operation period and the refresh enable signal as a pulse signal which is generated at a time of entering the refresh operation, depending on a logic level combination of the first internal chip select signal and the internal command in synchronization with the clock; and
a core circuit configured to perform the initializing operation for a plurality of memory cells during a period in which the initialization signal is enabled, and perform the refresh operation for the plurality of memory cells during a period in which the refresh signal is enabled.

17. The semiconductor device according to claim 16, wherein the command address buffer circuit comprises:
a second current mirror configured to supply current to a third node and a fourth node; and
a second charge emitter configured to generate the internal command address by differentially emitting charges of the third node and charges of the fourth node depending on logic levels of the buffer control signal and the command address.

18. A semiconductor device comprising:
a control circuit configured to generate a buffer control signal, which is enabled when entering an initializing operation and a refresh operation and is disabled when entering a normal operation;
a first buffer circuit configured to generate a first internal chip select signal based on the buffer control signal when entering the normal operation; and
a second buffer circuit configured to generate a second internal chip select signal based on the buffer control signal when entering the initialization operation and the refresh operation.

19. The semiconductor device according to claim 18, wherein the buffer control signal is disabled by sensing a logic level of the second internal chip select signal during the initializing operation and the refresh operation, and configured to generate an initialization signal, which is enabled during an initializing operation period, in response to a reset signal and the buffer control signal.

20. The semiconductor device according to claim 18, wherein the reset signal is a signal which is enabled to enter the initializing operation.

21. The semiconductor device according to claim 18, further comprising:

a command address buffer circuit configured to generate an internal command address by buffering a command address in response to the buffer control signal;

a command decoder configured to generate the refresh signal which is enabled during the refresh operation period and the refresh enable signal as a pulse signal which is generated at a time of entering the refresh operation, depending on a logic level combination of the first internal chip select signal and the internal command in synchronization with the clock; and a core circuit configured to perform the initializing operation for a plurality of memory cells during a period in which the initialization signal is enabled, and perform the refresh operation for the plurality of memory cells during a period in which the refresh signal is enabled.

* * * * *